(12) United States Patent
Xia

(10) Patent No.: US 11,631,836 B2
(45) Date of Patent: Apr. 18, 2023

(54) DISPLAY MODULE

(71) Applicant: Wuhan China Star Optoelectronics Semiconductor Display Technology Co., Ltd., Hubei (CN)

(72) Inventor: Hao Xia, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 211 days.

(21) Appl. No.: 17/278,676

(22) PCT Filed: Dec. 24, 2020

(86) PCT No.: PCT/CN2020/139015
§ 371 (c)(1),
(2) Date: Mar. 23, 2021

(87) PCT Pub. No.: WO2022/088457
PCT Pub. Date: May 5, 2022

(65) Prior Publication Data
US 2022/0310964 A1    Sep. 29, 2022

(30) Foreign Application Priority Data
Oct. 26, 2020    (CN) .......................... 202011154671.5

(51) Int. Cl.
*H05K 5/00*     (2006.01)
*H01L 51/52*    (2006.01)
*H05K 7/20*     (2006.01)

(52) U.S. Cl.
CPC ......... *H01L 51/529* (2013.01); *H05K 5/0017* (2013.01); *H05K 7/20954* (2013.01)

(58) Field of Classification Search
USPC ........................................................ 361/807
See application file for complete search history.

(56) References Cited

U.S. PATENT DOCUMENTS

| | | | |
|---|---|---|---|
| 10,191,517 B2 | 1/2019 | Kang | |
| 2014/0240933 A1* | 8/2014 | Lee | G06F 1/1656 29/831 |
| 2016/0210894 A1* | 7/2016 | Lee | H05K 1/189 |

FOREIGN PATENT DOCUMENTS

| | | | | |
|---|---|---|---|---|
| CN | 208029277 | | 10/2018 | |
| CN | 109375408 | | 2/2019 | |
| CN | 110491883 | | 11/2019 | |
| CN | 210535212 | | 5/2020 | |
| CN | 111599272 | | 8/2020 | |
| KR | 20180069763 | * | 6/2018 | ............... G06F 1/16 |

* cited by examiner

Primary Examiner — Hung S. Bui

(57) ABSTRACT

A display module includes a display panel, a first backplate, a super clear foam (SCF) assembly and a reinforcement plate. The first backplate is disposed on a side of a display panel opposite to a light emission surface. The SCF assembly and the reinforcement plate are disposed on a side of the first backplate opposite to the display panel. A receiving slot is defined in a side of the SCF assembly opposite to display panel. At least one part of the reinforcement plate is received in the receiving slot, and a driver chip is located on a side of the reinforcement plate opposite to the display panel.

20 Claims, 3 Drawing Sheets

DISPLAY MODULE

RELATED APPLICATIONS

This application is a National Phase of PCT Patent Application No. PCT/CN2020/139015 having International filing date of Dec. 24, 2020, which claims the benefit of priority of Chinese Patent Application No. 202011154671.5 filed on Oct. 26, 2020. The contents of the above applications are all incorporated by reference as if fully set forth herein in their entirety.

FIELD OF INVENTION

The present invention relates to a field of display technologies, especially relates to a display module.

FIELD AND BACKGROUND OF THE INVENTION

As display parts of electronic devices, display modules have been extensively applied to various electronic products. Designs of narrow bezels and ultra-thin modules are also increasingly favored by terminal manufacturers and consumers. End consumers' demands to a size of a bezel of a display module and a thickness of a display module become stricter. Designing a structure of a module with a narrow bezel and a ultra-thin thickness is an urgent issue to be solved.

Achievement of a narrow bezel solution mainly relies on bending of a bonding region such that a driver chip is bent to a rear of a display module. The rear of the display panel of the display module is attached with a structure of a super clean foam (SCF) and a reinforcement plate. The SCF structure functions as a cushion and the reinforcement plate performs a bonding function. A height of a bending region of the bonding region is usually defined by a thickness of a film layer under the display panel. In other words, it is determined by a thickness of the SCF structure and a thickness of the reinforcement plate. To achieve an ultra-thin module, it is required to design a radius of curvature of the bending region smaller. For achievement of a module structure design with a radius of curvature 0.2 millimeters, it is required to lower the height of the bending region, and usually, it is achieved by lowering the thickness of the reinforcement plate. However, a thin thickness of the reinforcement plate results in poor adhesion, which influences reliability of bending of the bonding region.

Therefore, it is required to improve structures of the conventional display module.

SUMMARY OF THE INVENTION

The embodiment of the present invention provides a display module to solve the issue that in a conventional display module, to achieve a design of a narrow bezel and an ultra-thin module, it is required to design a radius of curvature of a bending region smaller, i.e. to lower a height of the bending region. Usually, it is achieved by lowering the thickness of the reinforcement plate. However, a thin thickness of the reinforcement plate affects its adhesion, which influences reliability of bending of the bonding region.

To solve the above issue, technical solutions provided by the present invention are as follows.

An embodiment of the present invention provides a display module, comprising a display panel, a first backplate, a super clean foam (SCF) assembly, and a reinforcement plate, the display panel comprising a displaying region and a bonding end located on a side of the displaying region and comprising a bending portion, an end of the bonding end away from the displaying region connected to a driver chip, and the bonding end bent toward a side of the display panel opposite to a light emission surface of the display panel such that the driver chip is located on the side of the display panel opposite to the light emission surface; the first backplate disposed on the side of the display panel opposite to the light emission surface; the super clean foam (SCF) assembly disposed on a side of the first backplate opposite to the display panel; and the reinforcement plate disposed on the side of the first backplate opposite to the display panel; wherein a receiving slot is defined in a side of the SCF assembly opposite to the display panel, at least one part of the reinforcement plate is received in the receiving slot, and the driver chip is located on a side of the reinforcement plate opposite to the display panel; wherein the SCF assembly comprises an adhesive bonding layer, a foam layer, a polyimide layer and a metal layer that are sequentially stacked on the side of the first backplate opposite to the display panel, and an ultraviolet (UV) adhesive is attached to a surface of the bending portion.

In an embodiment of the present invention, the polyimide layer comprises a first hollow region defined through the polyimide layer, the metal layer comprises a second hollow region defined through the metal layer, and the first hollow region communicates with the second hollow region to define the receiving slot.

In an embodiment of the present invention, the reinforcement plate comprises a heat dissipation layer and a first pressure sensitive adhesive layer and a second pressure sensitive adhesive layer that are disposed on two opposite sides of the heat dissipation layer respectively.

In an embodiment of the present invention, a width and a length of the reinforcement plate are equal to a width and a length of the receiving slot respectively, and a thickness of the reinforcement plate is greater than a depth of the receiving slot.

In an embodiment of the present invention, the first pressure sensitive adhesive layer is located in the receiving slot and is bonded to the foam layer, and a side of the second pressure sensitive adhesive layer opposite to the heat dissipation layer protrudes from the receiving slot.

In an embodiment of the present invention, the bonding end comprises a first end, a second end, and the bending portion connected to the first end and the second end, the first end is connected to the displaying region, the second end is connected to the driver chip, the bending portion is bent and circular, and the second end is located on the side of the display panel opposite to the light emission surface.

In an embodiment of the present invention, a second backplate is disposed between the reinforcement plate and the second end, the second backplate is bonded to the second pressure sensitive adhesive layer.

In an embodiment of the present invention, a sum of a film thickness of the first end, a film thickness of the first backplate, a film thickness of the adhesive bonding layer, a film thickness of the foam, a film thickness of the reinforcement plate, and a film thickness of the second backplate is twice a radius of curvature of the bending portion.

The embodiment of the present invention further provides another display module, comprising a display panel, a first backplate, a super clean foam (SCF) assembly, and a reinforcement plate, the display panel comprising a displaying region and a bonding end located on a side of the displaying region and comprising a bending portion, an end of the bonding end away from the displaying region connected to a driver chip, and the bonding end bent toward a side of the display panel opposite to a light emission surface of the display panel such that the driver chip is located on the side of the display panel opposite to the light emission surface; the first backplate disposed on the side of the display panel opposite to the light emission surface; the super clean foam (SCF) assembly disposed on a side of the first backplate opposite to the display panel; and a reinforcement plate disposed on the side of the first backplate opposite to the display panel; wherein a receiving slot is defined in a side of the SCF assembly opposite to the display panel, at least one part of the reinforcement plate is received in the receiving slot, and the driver chip is located on a side of the reinforcement plate opposite to the display panel.

In an embodiment of the present invention, the SCF assembly comprises an adhesive bonding layer, a foam layer, a polyimide layer and a metal layer that are sequentially stacked on the side of the first backplate opposite to the display panel, and an ultraviolet (UV) adhesive is attached to a surface of the bending portion.

In an embodiment of the present invention, the adhesive bonding layer is a mesh adhesive.

In an embodiment of the present invention, the polyimide layer comprises a first hollow region defined through the polyimide layer, the metal layer comprises a second hollow region defined through the metal layer, and the first hollow region communicates with the second hollow region to define the receiving slot.

In an embodiment of the present invention, a bottom wall of the receiving slot is formed by a surface of a side of the foam layer opposite to the display panel.

In an embodiment of the present invention, the reinforcement plate comprises a heat dissipation layer and a first pressure sensitive adhesive layer and a second pressure sensitive adhesive layer that are disposed on two opposite sides of the heat dissipation layer respectively.

In an embodiment of the present invention, a width and a length of the reinforcement plate are equal to a width and a length of the receiving slot respectively, and a thickness of the reinforcement plate is greater than a depth of the receiving slot.

In an embodiment of the present invention, the first pressure sensitive adhesive layer is located in the receiving slot and is bonded to the foam layer, and a side of the second pressure sensitive adhesive layer opposite to the heat dissipation layer protrudes from the receiving slot.

In an embodiment of the present invention, the bonding end comprises a first end, a second end, and the bending portion connected to the first end and the second end, the first end is connected to the displaying region, the second end is connected to the driver chip, the bending portion is bent and circular, and the second end is located on the side of the display panel opposite to the light emission surface.

In an embodiment of the present invention, a second backplate is disposed between the reinforcement plate and the second end, the second backplate is bonded to the second pressure sensitive adhesive layer.

In an embodiment of the present invention, a sum of a film thickness of the first end, a film thickness of the first backplate, a film thickness of the adhesive bonding layer, a film thickness of the foam, a film thickness of the reinforcement plate, and a film thickness of the second backplate is twice a radius of curvature of the bending portion.

In an embodiment of the present invention, a surface of the bending portion is bonded with a UV adhesive.

By defining a receiving slot in the SCF assembly, at least part of the film layer of the reinforcement plate can be located in the receiving slot, which extremely lowers a total height in the bending region to fulfill a structural design requirement of the display module with a radius of curvature of 0.2 millimeters or less. Furthermore, under a circumstance of a great R angle rebounce force of a bending limit at the bonding end, adhesion of the reinforcement plate can be improved to enhance reliability of the bending bonding end.

DESCRIPTION OF SPECIFIC EMBODIMENTS OF THE INVENTION

The present invention provides a display module. To make the objective, the technical solution, and the effect of the present invention clearer and more explicit, the present invention will be further described in detail below with reference to the accompanying drawings. It should be understood that the specific embodiments described here are only used to explain the present invention instead of being used to limit the present invention.

The present invention aims at the technical issue that in a conventional display module, to achieve a design of a narrow bezel and an ultra-thin module, it is required to design the thickness of the reinforcement plate thinner, which results in poor adhesion and affects reliability of bending of the bonding region. The present embodiment can solve the defects.

Figure 1:
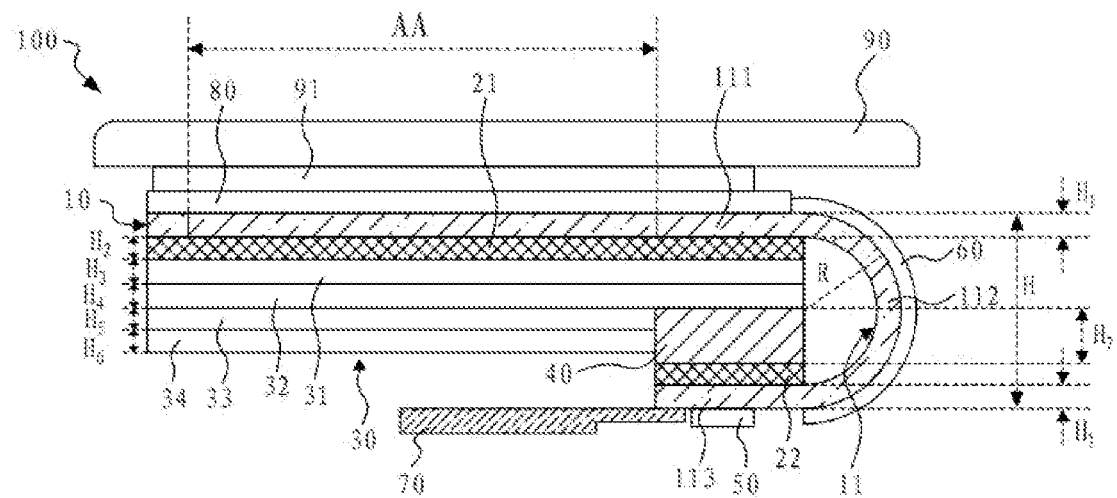
FIG. 1 is a schematic structural view of a display module provided by the embodiment of an present invention.

With reference to FIG. 1, an embodiment of the present invention provides a display module 100 comprising a display panel 10, a first backplate 21, a super clean foam (SCF) assembly 30, and a reinforcement plate 40. The first backplate 21 is disposed on a side of the display panel 10 opposite to a light emission surface of the display panel 10 (i.e. a lower side of the display panel 10 in the figures). The SCF assembly 30 is disposed on a side of the first backplate 21 opposite to the display panel 10, the reinforcement plate 40 is disposed on the side of the first backplate 21 opposite to the display panel 10.

Figure 3:
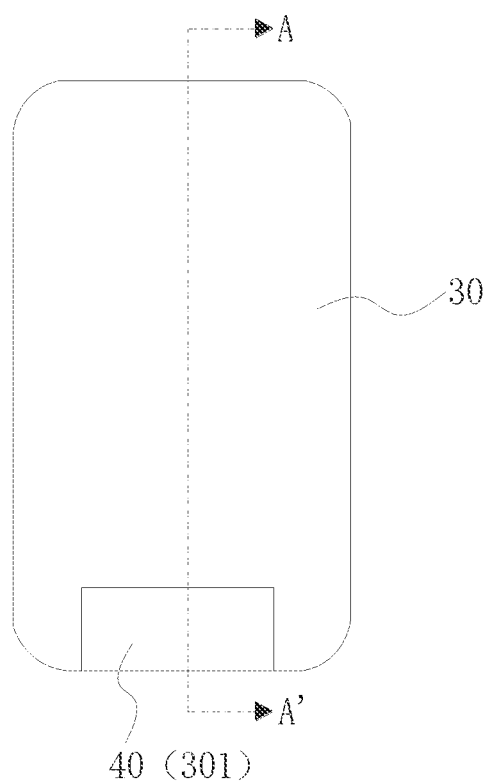
FIG. 3 is a top view of a SCF assembly provided by the embodiment of the present invention.

With reference to FIG. 3, wherein a receiving slot 301 is defined in a side of the SCF assembly 30 opposite to the display panel 10, and at least one part of the reinforcement plate 40 is received in the receiving slot 301.

With reference to FIG. 1, the display panel 10 comprises a displaying region AA, the displaying region AA is configured to display screen images. To achieve a design of a narrow bezel, the display panel 10 further comprises a bonding end 11 located on a side of the displaying region AA. The bonding end 11 is bendable. The bonding end 11 is configured to connect signal wires in the displaying region AA to a driver chip 50. An end of the bonding end 11 away from the displaying region AA is connected to the driver chip 50, the bonding end 11 is bent toward the side of the display panel 10 opposite to the light emission surface of the display panel 10 such that the driver chip 50 is located on the side of the display panel 10 opposite to the light emission surface.

In an embodiment, the driver chip 50 is a source electrode driver chip. In another embodiment, the driver chip 50 can be a gate electrode driver chip, and can be an integrated chip of the source electrode driver chip and the gate electrode driver chip.

In an embodiment, the SCF assembly 30 is a composite film layer structure and the receiving slot 301 thereof can be achieved by making an opening in a part of the film layer structure such that at least part of the film layer of the reinforcement plate 40 is located in the receiving slot 301. Even a radius of curvature of the bonding end 11 is required to be reduced, a thickness of the reinforcement plate 40 does not have to be reduced, which can improve adhesion of the reinforcement plate 40 to further guarantee reliability of bending of the bonding end 11.

Figure 4:
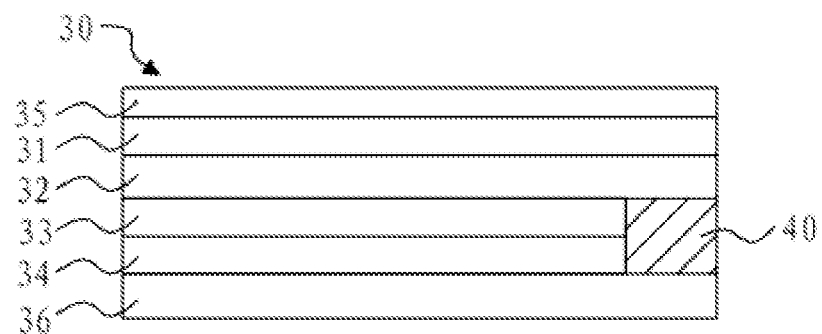
FIG. 4 is a schematic structural view of a cross section along line AA' in FIG. 3.

Specifically, in an embodiment, With reference to FIGS. 1 and 4, the SCF assembly 30 can comprises an adhesive bonding layer 31, a foam layer 32, a polyimide layer 33, and metal layer 34 that are stacked sequentially on the side of the first backplate 21 opposite to the display panel 10.

The adhesive bonding layer 31 is bonded to the first backplate 21, the adhesive bonding layer 31 can be a mesh adhesive (Embo), the mesh adhesive has functions of bonding and air exhaustion and is flexible, which would not influence a flexibility design of the display module. In another embodiment, the adhesive bonding layer 31 can be other adhesive layer.

In an embodiment, the foam layer 32 can be foam, the foam not only has a cushion function but also has a light shielding function.

The polyimide layer 33 can perform a reinforcement function to increase reliability of the SCF assembly 30. In another embodiment, the SCF assembly 30 can exclude the polyimide layer 33.

In another embodiment, the polyimide layer 33 can be replaced with a graphite layer, and polyimide can be covered on an outer surface of the graphite layer.

Material of the metal layer 34 can be metal such as copper, aluminum, or a alloy thereof. The metal layer 34 can perform a heat dissipation function. Specifically, the metal layer 34 can be a copper foil or an aluminum foil.

Because the foam layer 32 performs a light shielding function, the foam layer 32 needs to be disposed on an entire surface. A hollow foam layer 32 would results in light leakage. Therefore, the receiving slot 301 can be achieved by hollowing the metal layer 34 and the polyimide layer 33.

Figure 5:
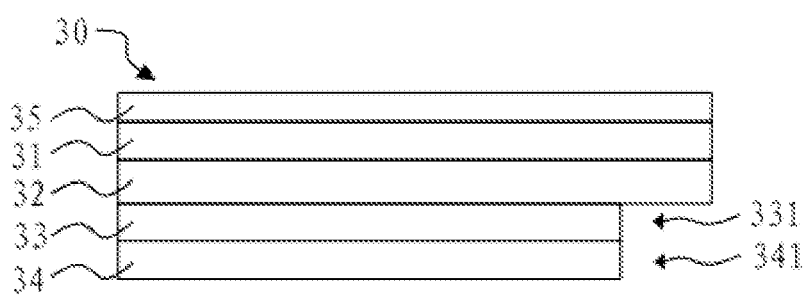
FIG. 5 is a schematic structural view the SCF assembly provided by the embodiment of the present invention.

Specifically, With reference to FIG. 5, the polyimide layer 33 comprises a first hollow region 331 defined through the polyimide layer 33. The metal layer 34 comprises a second hollow region 341 defined through the metal layer 34. The first hollow region 331 communicates with the second hollow region 341 to form the receiving slot 301.

The first hollow region 331 and the second hollow region 341 are defined near corresponding ends of the film layer respectively. Specifically, the first hollow region 331 can be obtained by hollowing an end of a side of the polyimide layer 33 near the bonding end 11, and the second hollow region 341 are obtained by the same process.

A bottom wall of the receiving slot 301 is formed by a side surface of the foam layer 32 opposite to the display panel. Therefore, the reinforcement plate 40 can be disposed in the receiving slot 301 through its adhesive layer bonded to the foam layer 32.

The reinforcement plate 40 can be bonded to the SCF assembly through a seamless technology. Specifically, a width and a length of the reinforcement plate 40 can be designed to be equal to a width and a length of the receiving slot 301 respectively such that no seam exists between the reinforcement plate 40 and a sidewall and a bottom wall of the receiving slot 301 after the reinforcement plate 40 is bonded to the SCF assembly.

A thickness of the reinforcement plate 40 can be designed depending on actual demands. In an embodiment, the thickness of the reinforcement plate 40 is greater than a depth of the receiving slot 301. In another embodiment, with reference to FIG. 4, the thickness of the reinforcement plate 40 can be equal to the depth of the receiving slot 301, in other words, the thickness of the reinforcement plate 40 is equal to a sum of a thickness of the metal layer 34 and a thickness of the polyimide layer 33.

The embodiment of the present invention, by defining the receiving slot 301 in SCF assembly, makes at least part of the film layer of the reinforcement plate 40 received in the receiving slot 301. Compared to the prior art, under a circumstance of the same R angle design at the bonding end 11, the adhesive layer of the reinforcement plate 40 can be designed to be thicker to mitigate the issue of poor adhesion of a conventional reinforcement plate, which can improves bending reliability of the bonding end 11.

Figure 2:
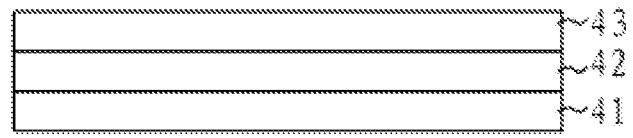
FIG. 2 is a schematic structural view of a reinforcement plate provided by the embodiment of the present invention.

In an embodiment, with reference to FIG. 2, the reinforcement plate 40 comprises a heat dissipation layer 42 and a first pressure sensitive adhesive layer 43 and a second pressure sensitive adhesive layer 41 disposed on two opposite sides of the heat dissipation layer 42 respectively.

With reference to FIG. 1, the first pressure sensitive adhesive layer 43 is located in the receiving slot 301 and is bonded to the foam layer 32.

A side of the second pressure sensitive adhesive layer 41 opposite to the heat dissipation layer 42 protrudes from the receiving slot 301. The second pressure sensitive adhesive layer 41 is bonded to an end of the bonding end 11 bent to the rear of the display panel 10 to fasten a bending portion of the bonding end 11.

The heat dissipation layer 42 functions for shielding and heat dissipation. In an embodiment, material of the heat dissipation layer 42 can be heat dissipation material, specifically can be metal material, for example, a copper foil or an aluminum foil, or polyethylene terephthalate (PET) material, and can also be wave-absorption material.

With reference to FIG. 1, the bonding end 11 of the embodiment of the present invention comprises a first end 111, a second end 113, and a bending portion 112 connecting the first end 111 and the second end 113.

The first end 111 is connected to the displaying region AA, and the second end 113 is connected to the driver chip 50. The bending portion 112 is bendable to be curved such that the second end 113 is located on a side opposite to the light emission surface of the display panel 10 (i.e., a rear of the display panel 10).

The second end 113 is adhered to the second pressure sensitive adhesive layer 41 to achieve fastening the bending portion 112.

In an embodiment, a second backplate 22 is further disposed between the second end 113 and the second pressure sensitive adhesive layer 41. The second backplate 22 is adhered to the second pressure sensitive adhesive layer 41.

The first backplate 21 and the second backplate 22 performs the function of supporting the display panel 10. The first backplate 21 and the second backplate 22 can be obtained by patterning the same backplate. After the bonding end 11 is manufactured, the backplate is patterned to etch the backplate corresponding to the region of the bending portion 112 to prevent the backplate in the region from affecting a bending capability of the bending portion 112.

In an embodiment, an ultraviolet (UV) adhesive is attached to a surface of the bending portion 112 to enhance the bending capability of the bending portion 112, which facilitates bending and curving of the bending portion 112.

With reference to FIG. 1, a height H between a top surface of the first end 111 and a bottom surface of the second end 113 is twice a radius of curvature R (i.e., the radius of a curve) of the bending portion 112.

Specifically, a sum of a thickness of the first end 111 film and a thickness of the first backplate 21 film, a thickness of the adhesive bonding layer 31 film, a thickness of the foam layer 32 film, a thickness of the reinforcement plate 40 film, and a thickness of the second backplate 22 film are twice the radius of curvature R of the bending portion 112.

When a radius of curvature of the bonding end 11 is required to be 0.2 millimeters or less, the conventional technology needs to reduce the thickness of the reinforcement plate 40, which results poor adhesion of the reinforcement plate 40. With reference to FIG. 1, for example, a film thickness of the first end 111 is equal to a film thickness of the second end 113, which is $H_1$. Film thicknesses of the first backplate 21 and the second backplate 22 are equal, which are $H_2$. A film thickness of the adhesive bonding layer 31 is $H_3$. A film thickness of the foam layer 32 is $H_4$. A film thickness of the polyimide layer 33 is $H_5$. A film thickness of the metal layer 34 is $H_6$. A film thickness of the reinforcement plate 40 is $H_7$. For a conventional display module, because of no design of a receiving slot 301, the reinforcement plate 40 is bonded to the metal layer 34. Therefore, the polyimide layer 33 and the metal layer 34 of the SCF assembly 30 still occupy a certain height space. Thus, in the conventional display module, $H=2H_1+2H_2+H_3+H_4+H_5+H_6+H_7$; for the display module of the present embodiment, $H=2H_1+2H_2+H_3+H_4+H_7$. Therefore, when the value of H is the same, the thickness of the reinforcement plate 40 of the present embodiment can be make thicker, which can increase thicknesses of the first pressure sensitive adhesive layer 43 and the second pressure sensitive adhesive layer 41 to improve connection stability between the reinforcement plate 40 and the SCF layer and the bonding end 11, which guarantees reliability of the bonding end 11 structure.

The second end 113 is connected to a flexible printed circuit board (FPC) 70.

With reference to FIG. 4, before the SCF assembly 30 is assembled with the display panel 10, the SCF assembly further comprises a release film 35 and a protective film 36 disposed on two opposite sides of its film layer.

Specifically, the release film 35 is disposed on a side of the adhesive bonding layer 31 away from the foam layer 32, the protective film 36 is disposed on a side of the metal layer 34 away from the polyimide layer 33.

After the adhesive bonding layer 31 is manufactured, the release film 35 is attached to an outer surface of the adhesive bonding layer 31 to protect the adhesive bonding layer 31. After hollow regions are defined in the polyimide layer 33 and the metal layer 34, the reinforcement plate is bonded to the receiving slot 301, then the protective film 36 is bonded to the reinforcement plate 40 and the metal layer 34 for transport and post processes.

It can be understood that after bonding, the SCF assembly 30 and the reinforcement plate 40 are formed integrally. During bonding of the integral assembly and the display panel 10, the release film 35 and the protective film 36 are required to be torn off sequentially.

Specifically, first the release film 35 is torn off, the adhesive bonding layer 31 is bonded to the first backplate 21, then the protective film 36 is torn off, the bonding end 11 is bent such that the second end 113, the second backplate 22, and the driver chip 50 are located on a side opposite to the light emission surface to further bond the second backplate 22 to the second pressure sensitive adhesive layer 41.

A polarizer 80 is further bonded to a side of the light emission surface of the display panel 10. A cover lid 90 is attached to the polarizer 80, the cover lid 90 is bonded to the polarizer 80 through an optical clear adhesive layer 91.

In an embodiment, the display panel 10 can be an organic light emitting diode (OLED) display panel and can be used to manufacture a flexible display panel.

By defining a receiving slot 301 in the SCF assembly 30, at least part of the film layer of the reinforcement plate 40 can be located in the receiving slot 301, which extremely lowers a total height in the bending region to fulfill a structural design requirement of the display module with a radius of curvature of 0.2 millimeters or less. Furthermore, under a circumstance of a great R angle rebounce force of a bending limit at the bonding end 11, adhesion of the reinforcement plate 40 can be improved to enhance reliability of the bending bonding end 11.

The specific operations above can refer to the above embodiment, which will not be described repeatedly.

As described above, the present invention achieves the purpose of using physical keys for text information input by directly covering the physical keyboard on the touch screen of the mobile terminal, and the physical keyboard is not necessarily connected to the power supply for driving, which achieves the effect of attaching and using, and Reduced the cost and power consumption of mobile terminals.

It can be understood that for a person of ordinary skill in the art, equivalent replacements or changes can be made according to the technical solution of the present invention and its inventive concept, and all these changes or replacements should belong to the scope of protection of the appended claims of the present invention.

What is claimed is:

1. A display module, comprising:
   a display panel comprising a displaying region and a bonding end located on a side of the displaying region and comprising a bending portion, an end of the bonding end away from the displaying region connected to a driver chip, and the bonding end bent toward a side of the display panel opposite to a light emission surface of the display panel such that the driver chip is located on the side of the display panel opposite to the light emission surface;
   a first backplate disposed on the side of the display panel opposite to the light emission surface;
   a super clean foam (SCF) assembly disposed on a side of the first backplate opposite to the display panel; and
   a reinforcement plate disposed on the side of the first backplate opposite to the display panel;
   wherein a receiving slot is defined in a side of the SCF assembly opposite to the display panel, at least one part of the reinforcement plate is received in the receiving slot, and the driver chip is located on a side of the reinforcement plate opposite to the display panel;

wherein the SCF assembly comprises an adhesive bonding layer, a foam layer, a polyimide layer and a metal layer that are sequentially stacked on the side of the first backplate opposite to the display panel, and an ultraviolet (UV) adhesive is attached to a surface of the bending portion.

2. The display module according to claim 1, wherein the polyimide layer comprises a first hollow region defined through the polyimide layer, the metal layer comprises a second hollow region defined through the metal layer, and the first hollow region communicates with the second hollow region to define the receiving slot.

3. The display module according to claim 2, wherein the reinforcement plate comprises a heat dissipation layer and a first pressure sensitive adhesive layer and a second pressure sensitive adhesive layer that are disposed on two opposite sides of the heat dissipation layer respectively.

4. The display module according to claim 3, wherein a width and a length of the reinforcement plate are equal to a width and a length of the receiving slot respectively, and a thickness of the reinforcement plate is greater than a depth of the receiving slot.

5. The display module according to claim 3, wherein the first pressure sensitive adhesive layer is located in the receiving slot and is bonded to the foam layer, and a side of the second pressure sensitive adhesive layer opposite to the heat dissipation layer protrudes from the receiving slot.

6. The display module according to claim 3, wherein the bonding end comprises a first end, a second end, and the bending portion connected to the first end and the second end, the first end is connected to the displaying region, the second end is connected to the driver chip, the bending portion is bent and circular, and the second end is located on the side of the display panel opposite to the light emission surface.

7. The display module according to claim 6, wherein a second backplate is disposed between the reinforcement plate and the second end, the second backplate is bonded to the second pressure sensitive adhesive layer.

8. The display module according to claim 7, wherein a sum of a film thickness of the first end, a film thickness of the first backplate, a film thickness of the adhesive bonding layer, a film thickness of the foam, a film thickness of the reinforcement plate, and a film thickness of the second backplate is twice a radius of curvature of the bending portion.

9. A display module, comprising:
a display panel comprising a displaying region and a bonding end located on a side of the displaying region and comprising a bending portion, an end of the bonding end away from the displaying region connected to a driver chip, and the bonding end bent toward a side of the display panel opposite to a light emission surface of the display panel such that the driver chip is located on the side of the display panel opposite to the light emission surface;
a first backplate disposed on the side of the display panel opposite to the light emission surface;
a super clean foam (SCF) assembly disposed on a side of the first backplate opposite to the display panel; and
a reinforcement plate disposed on the side of the first backplate opposite to the display panel;
wherein a receiving slot is defined in a side of the SCF assembly opposite to the display panel, at least one part of the reinforcement plate is received in the receiving slot, and the driver chip is located on a side of the reinforcement plate opposite to the display panel.

10. The display module according to claim 9, wherein the SCF assembly comprises an adhesive bonding layer, a foam layer, a polyimide layer and a metal layer that are sequentially stacked on the side of the first backplate opposite to the display panel, and an ultraviolet (UV) adhesive is attached to a surface of the bending portion.

11. The display module according to claim 10, wherein the adhesive bonding layer is a mesh adhesive.

12. The display module according to claim 10, wherein the polyimide layer comprises a first hollow region defined through the polyimide layer, the metal layer comprises a second hollow region defined through the metal layer, and the first hollow region communicates with the second hollow region to define the receiving slot.

13. The display module according to claim 12, wherein a bottom wall of the receiving slot is formed by a surface of a side of the foam layer opposite to the display panel.

14. The display module according to claim 12, wherein the reinforcement plate comprises a heat dissipation layer and a first pressure sensitive adhesive layer and a second pressure sensitive adhesive layer that are disposed on two opposite sides of the heat dissipation layer respectively.

15. The display module according to claim 14, wherein a width and a length of the reinforcement plate are equal to a width and a length of the receiving slot respectively, and a thickness of the reinforcement plate is greater than a depth of the receiving slot.

16. The display module according to claim 14, wherein the first pressure sensitive adhesive layer is located in the receiving slot and is bonded to the foam layer, and a side of the second pressure sensitive adhesive layer opposite to the heat dissipation layer protrudes from the receiving slot.

17. The display module according to claim 14, wherein the bonding end comprises a first end, a second end, and the bending portion connected to the first end and the second end, the first end is connected to the displaying region, the second end is connected to the driver chip, the bending portion is bent and circular, and the second end is located on the side of the display panel opposite to the light emission surface.

18. The display module according to claim 17, wherein a second backplate is disposed between the reinforcement plate and the second end, the second backplate is bonded to the second pressure sensitive adhesive layer.

19. The display module according to claim 18, wherein a sum of a film thickness of the first end, a film thickness of the first backplate, a film thickness of the adhesive bonding layer, a film thickness of the foam, a film thickness of the reinforcement plate, and a film thickness of the second backplate is twice a radius of curvature of the bending portion.

20. The display module according to claim 9, wherein an ultraviolet (UV) adhesive is attached to a surface of the bending portion.

* * * * *